United States Patent
Ogami et al.

(10) Patent No.: US 6,701,487 B1
(45) Date of Patent: Mar. 2, 2004

(54) USER DEFINED NAMES FOR REGISTERS IN MEMORY BANKS DERIVED FROM CONFIGURATIONS

(75) Inventors: Kenneth Y. Ogami, Bothell, WA (US); Steve Roe, Woodinville, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 75 days.

(21) Appl. No.: 09/989,775

(22) Filed: Nov. 19, 2001

(51) Int. Cl.[7] .............................................. G06F 17/50
(52) U.S. Cl. ......................................................... 716/1
(58) Field of Search ........................ 716/1–14; 395/500, 395/180

(56) References Cited

U.S. PATENT DOCUMENTS

| | | | | |
|---|---|---|---|---|
| 5,321,828 A | * | 6/1994 | Phillips et al. | 703/28 |
| 5,557,774 A | * | 9/1996 | Shimabukuro et al. | 703/21 |
| 5,600,799 A | * | 2/1997 | Young et al. | 710/100 |
| 6,092,175 A | * | 7/2000 | Levy et al. | 712/23 |
| 6,286,027 B1 | * | 9/2001 | Dwyer et al. | 709/107 |

* cited by examiner

Primary Examiner—Vuthe Siek
Assistant Examiner—Sun James Lin
(74) Attorney, Agent, or Firm—Wagner, Murabito & Hao LLP

(57) ABSTRACT

A system and method for displaying a customized register name, an associated physical address, and an associated value in a software design tool. The customized register name identifies a user module and a configuration register of the user module. The user module is a circuit design to be realized in a programmable electronic circuit. The customized register name can be automatically generated based on the user module name and the configuration register name. The customized register name can also be modified as a unique identifier by a user. The physical address and value of the configuration register can be automatically updated based on modifications of the user module and/or hardware resources assigned to the user module.

24 Claims, 3 Drawing Sheets

USER DEFINED NAMES FOR REGISTERS IN MEMORY BANKS DERIVED FROM CONFIGURATIONS

RELATED APPLICATIONS

U.S. patent application Serial No. 10/033,027, entitled "PROGRAMMABLE MICROCONTROLLER ARCHITECTURE," filed on Oct. 22, 2001, and with inventor Warren Snyder is hereby incorporated by reference.

FIELD OF THE INVENTION

The invention relates generally to the field of chip design software applications, more particularly to a system and method for utilizing customized register names for registers in memory banks.

BACKGROUND OF THE INVENTION

It is often useful to utilize circuit design application software to layout and plan new integrated circuits. This circuit design application software is typically configured to aid the user in keeping track of resource requirements of particular modules. Furthermore, circuit design application software also allows users to assign chip resources to implement particular modules or "designs."

However, circuit design software applications are typically not easily customizable. In order to configure a hardware block to perform a specific function, in the past, the circuit designer needed to remember the physical addresses of the registers and then program them accordingly. The actual physical addresses are inserted into the source code sections and specific values were loaded therein. If a module was to be implemented on another hardware element, then a new set of registers needed to be used and recalled because each hardware element offers a different physical address for the same configuration register. The process of remembering physical addresses for the registers can be very error-prone and tedious.

Circuit designers are typically required to manually and textually track their layout decisions with minimal graphical support. This is especially true for programming microcontrollers.

SUMMARY OF THE INVENTION

It is useful to supply a circuit designer with a circuit design application software that provides the circuit designer with a comprehensive display utilizing customizable labels associated with particular physical address and also displaying any associated values.

A system and method are described for displaying a customized register name, an associated physical address, and an associated value. The customized register name identifies a user module and a corresponding configuration register of the user module. The customized register name can be automatically generated based on the user module name and the configuration register name. The customized register name can also be modified as a unique identifier by a user. The physical address register and value of the configuration register can be automatically updated based on modifications of the user module and/or hardware resources assigned to the user module.

More specifically, embodiments of the present invention are directed to a method of generating program code for a programmable electronic device comprising: a) associating a register textual label with a configuration register of an electronic circuit design; b) associating the electronic circuit design with a first programmable hardware resource, the first programmable hardware resource comprising first physical register addresses; c) automatically associating the configuration register with a physical address of the first physical register addresses; and d) rendering a display comprising the textual label of the configuration register and the physical address of the first physical register addresses. Embodiments also include the above and wherein the programmable electronic device is a programmable microcontroller device.

Embodiments also include a method as described above further comprising: e) associating the electronic circuit design with a second programmable hardware resource, the second programmable hardware resource comprising second physical register addresses; f) automatically associating the configuration register with a new physical address of the second physical register addresses; and g) updating the display to comprise the textual label of the configuration register and the new physical address of the second physical register addresses.

Embodiments include the above and wherein the display is a textual grid display further comprising a plurality of textual labels and associated respective physical addresses and further comprising automatically generating source code for programming the programmable electronic device to implement the electronic circuit design, the source code comprising a mapping between the textual label and the physical address.

Other aspects and advantages of the invention will become apparent from the following detailed description, taken in conjunction with the accompanying drawings, and illustrated by way of example of the principles of the invention.

DETAILED DESCRIPTION

Specific reference is made in detail to the embodiments of the invention, examples of which are illustrated in the accompanying drawings. While the invention is described in conjunction with the embodiments, it will be understood that the embodiments are not intended to limit the scope of the invention. The various embodiments are intended to illustrate the invention in different applications. Further, specific details are set forth in the embodiments for exemplary purposes and are not intended to limit the scope of the invention. In other instances, well-known methods, procedures, and components have not been described in detail as not to unnecessarily obscure aspects of the invention.

Figure 1:
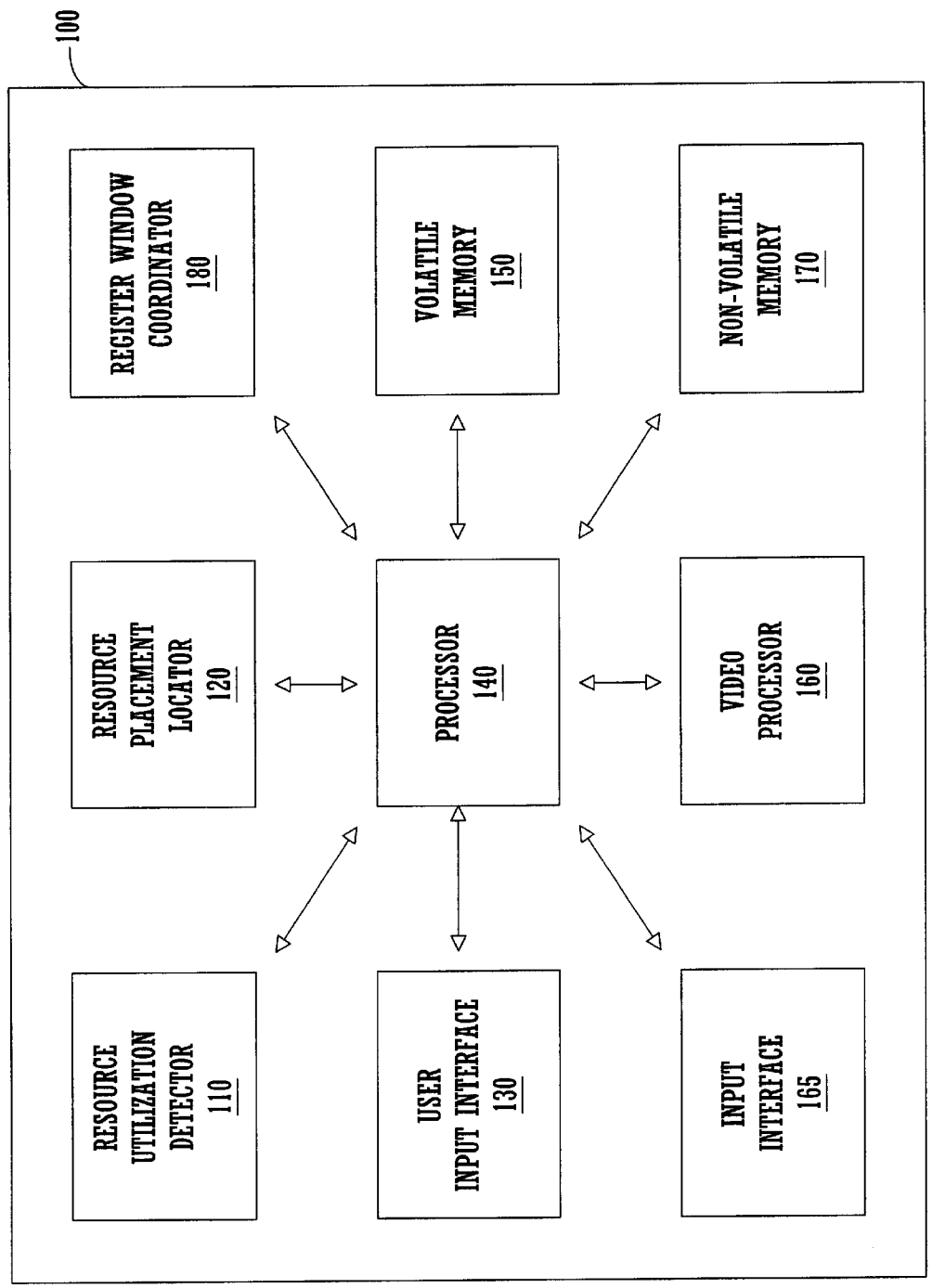
FIG. 1 illustrates a system for generating customized register names in accordance with one embodiment of the invention.

With reference to FIG. 1, a system 100 for utilizing customized register names that is associated with a configuration register of a user module according to one embodiment of the invention is shown. The system 100 operates within a design application to create and display customized register names which correlate to a particular configuration register of a user module. Further, the system 100 also operates to display an associated value which is correlated to the particular configuration register and a physical address of the particular configuration register.

The system 100 includes a processor 140, a user input interface 130, volatile memory 150, an optional video processor 160, an input interface 165, and non-volatile memory 170. The user input interface 130, the volatile memory 150, the optional video processor 160, the input interface 165, and the non-volatile memory 170 are connected to the processor 140. The user input interface 130, the processor 140, the volatile memory 150, the optional video processor 160, the input interface 165, and the non-volatile memory 170 are components that are readily found in personal computer systems. The input user interface 130 may comprise a mouse or other cursor control device and a keyboard.

The system 100 further includes a resource utilization detector 110, a resource placement locator 120, and a register window coordinator 180, which are also connected to the processor 140. The components 110, 120, and 180 are merely illustrated in FIG. 1 as one embodiment of the system 100. Although the components 110, 120, and 180 are illustrated in FIG. 1 as separate components of the system 100, two or more of these components may be integrated, thus decreasing the number of components in the system 100. Similarly, the components 110, 120, and 180 may also be separated, thus increasing the number of components within the system 100. The components 110, 120, and 180 may be implemented in any combination of hardware, firmware and/or software.

In one embodiment, the system 100 helps users more accurately and efficiently design integrated circuit layouts. The system 100 automatically tracks configuration registers of resources associated with a user module. Further, the system 100 also displays the customized register name associated with the configuration register, the physical address of the configuration register, and the value associated with the configuration register. There may be many configuration registers associated with each hardware resource. In turn, each user module may require a plurality of hardware resources. The user module may require multiple analog and digital resources to implement the user module. The user module may be either placed or unplaced. A placed user module already has committed resources on the chip dedicated to the user module. An unplaced user module currently does not have resources on the chip dedicated to the user module.

The system 100 is capable of graphically tracking the resources committed to a placed user module and graphically suggesting potential resources that would satisfy an unplaced user module.

In one embodiment, the system 100 is configured to support microcontroller design. In another embodiment, the system 100 is configured to support programmable system design. In yet another embodiment, the system 100 supports general chip design.

The input interface 165 provides a means for the system 100 to receive user input which may include selection of various user module and resources and command sequences. The input interface 165 may be a USB port, a serial port, Ethernet port, or any other interface port configured to transmit electronic data to the system 100.

The video processor 160 provides graphical output from the system 100. The video processor 160 is configured to display color coded user modules and corresponding resources.

The resource utilization detector 110 surveys the resources within a chip. In one embodiment, the resource utilization detector 110 identifies the available resources and the utilized resources. The resource utilization detector 110 also links the placed user module with the corresponding associated utilized resources. In another embodiment, the resource utilization detector 110 also automatically tracks configuration registers of resources associated with a user module.

The resource placement locator 120 locates available resources that would be suitable for an unplaced module. In one embodiment, the resource placement locator 120 is configured to accept the requirements for the unplaced module and to search for a resource from the available resources that would satisfy these requirements.

In another embodiment, the resource placement locator 120 sequentially searches for possible resource configurations from the available resources. For example, the resource placement locator 120 can be configured to find a first set of resources which fulfill the requirements for the unplaced module. Next, the resource placement locator 120 can be configured to sequentially find a second set of resources that are different from the first set of resources which also fulfill the requirements for the unplaced module.

The register window coordinator 180 communicates with the resource utilization detector 110 and the resource placement locator 120. In one embodiment, the register window coordinator 180 automatically associates a customized register name with each configuration register of the hardware resources associated with the user module. This customized register name can be easy to read and identify the associated user module and configuration register. This customized register name can also include a unique user module name and a label that describes the function of the particular register. For example, if a user module is called "timer_1" and the configuration register is a timer limit value, then the customized register name could be "Timer_1_timer_limit_value." Naturally, in other embodiments, the format of the register name or customizable label can take various formats without departing from the scope or intent of the invention.

In other embodiments, this register name can be seen in source code generated by the design software application. When the user module is actually placed, then the actual physical address of this register as found in the hardware resource is associated with the customized register name. The register name can be configured to be easy to provide meaningful identification that is user friendly. Moreover, if the user module is moved from one hardware resource to another, then the new physical address of the configuration register is associated with the register name automatically. The user can use the register name in source code and in data displays.

Figure 2:
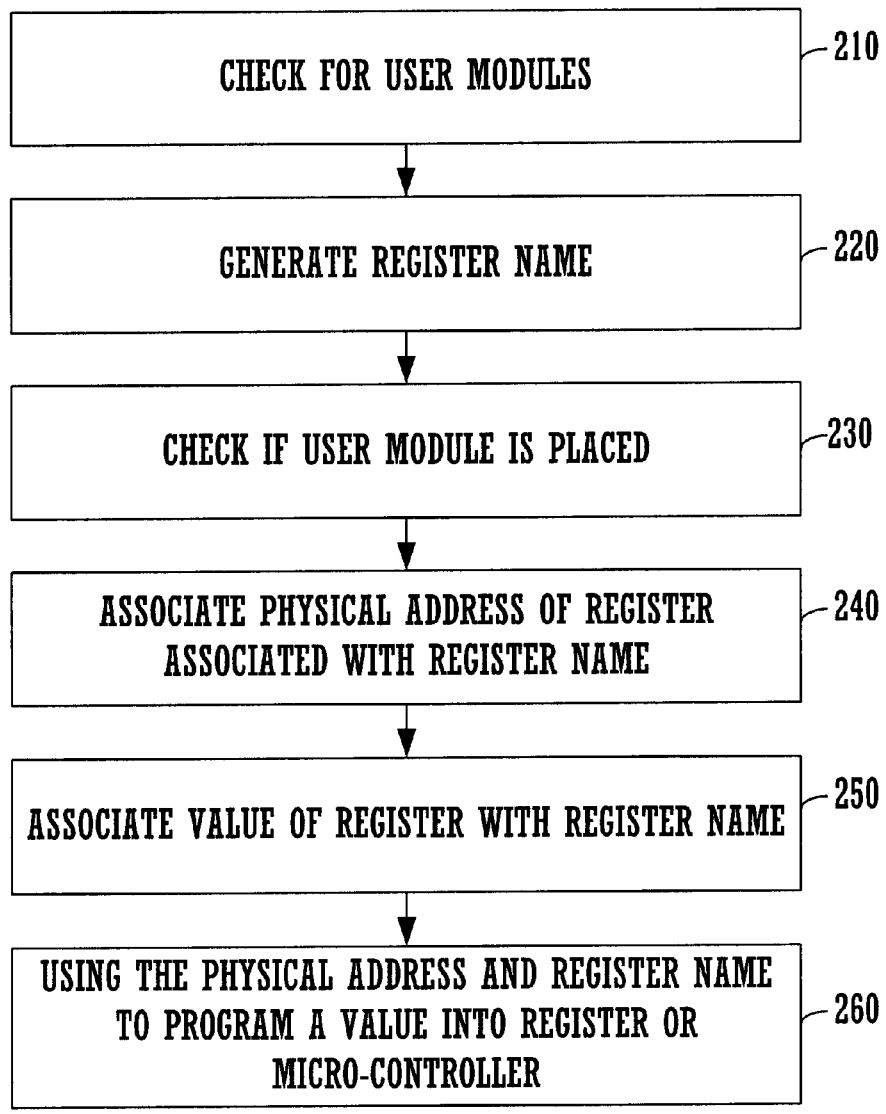
FIG. 2 illustrates a process flow diagram of one embodiment of the invention.

FIG. 2 illustrates a process flow diagram in accordance with one embodiment of the invention. The functional blocks are not to be construed as limiting the number of functional blocks within the process flow diagrams nor to be construed as a requirement for every functional block. The blocks may be performed in a different sequence without departing from the spirit of the invention. Further, blocks may be deleted, added or combined without departing from the spirit of the invention.

FIG. 2 illustrates one embodiment showing the process of utilizing a customized register name. In Block 210, a check is performed for user modules. User modules include both placed and unplaced user modules. Placed user modules are characterized by having hardware resources assigned to the user module which fulfill the hardware requirements of the user module. Unplaced user modules are characterized by not having hardware resources assigned to the user module.

In one embodiment, a user module becomes placed in a hardware resource by programming specific hardware configuration registers associated with the resource.

In Block 220, a customized register name is generated. In one embodiment, the customized register name is generated based on the user module and the specific register being described. For example, if a user module is called "timer_2" and the configuration register is a timer limit value, then the customized register name could be "Timer_2_timer_limit_value." In another embodiment, the user can change the customized register name to any desired identifier as the long as the customized register names are unique.

In Block 230, a check is made to determine whether the user modules are placed.

In Block 240, a physical address of a specific register is associated with the customized register name. In one embodiment, if the user module associated with the customized register name is unplaced, then the physical address of the specific register may not be obtainable. One use is that the software automatically generates source code that contains the register name associated with the physical address mapping. Therefore, the user, when examining the source code sees an easy to read register label rather than only the physical address. The source code contains a table or equivalent statement that maps the address to the register name. This equivalence statement is automatically generated in the source code.

In Block 250, a value of the specific register is also associated with the customized register name. In one embodiment, if the user module associated with the customized register name is unplaced, then the value of the specific register may not be obtainable.

In Block 260, a value can be programmed into the physical address associated with the customized register name. By using the customized register name, the value can be programmed into the register represented by the physical address within the programmable microcontroller device. Further, the design software may automatically generate source code, e.g., APIs, that contain the register name to physical address mapping. Therefore, the user, when examining the source code will see an easy to read register label rather than the physical address only. The source code contains a table, or equivalence statement that maps the address to the register name. This equivalent statement is automatically generated in the source code according to embodiments of the present invention.

For example, Table 1 below illustrates one representation of the physical address and value of the specific register associated with the customized register name. The physical address "08h" and value "55" is associated with the customized register name "Timer_1_timer_limit_value". Further, the physical address "09h" and value "10" is associated with the customized register name "Timer_1_counter_data_reg".

TABLE 1

| Physical Address | Register Name | Value |
| --- | --- | --- |
| 08h | Timer_1_timer_limit_value | 55 |
| 09h | Timer_1_counter_data_reg | 10 |

Figure 3:
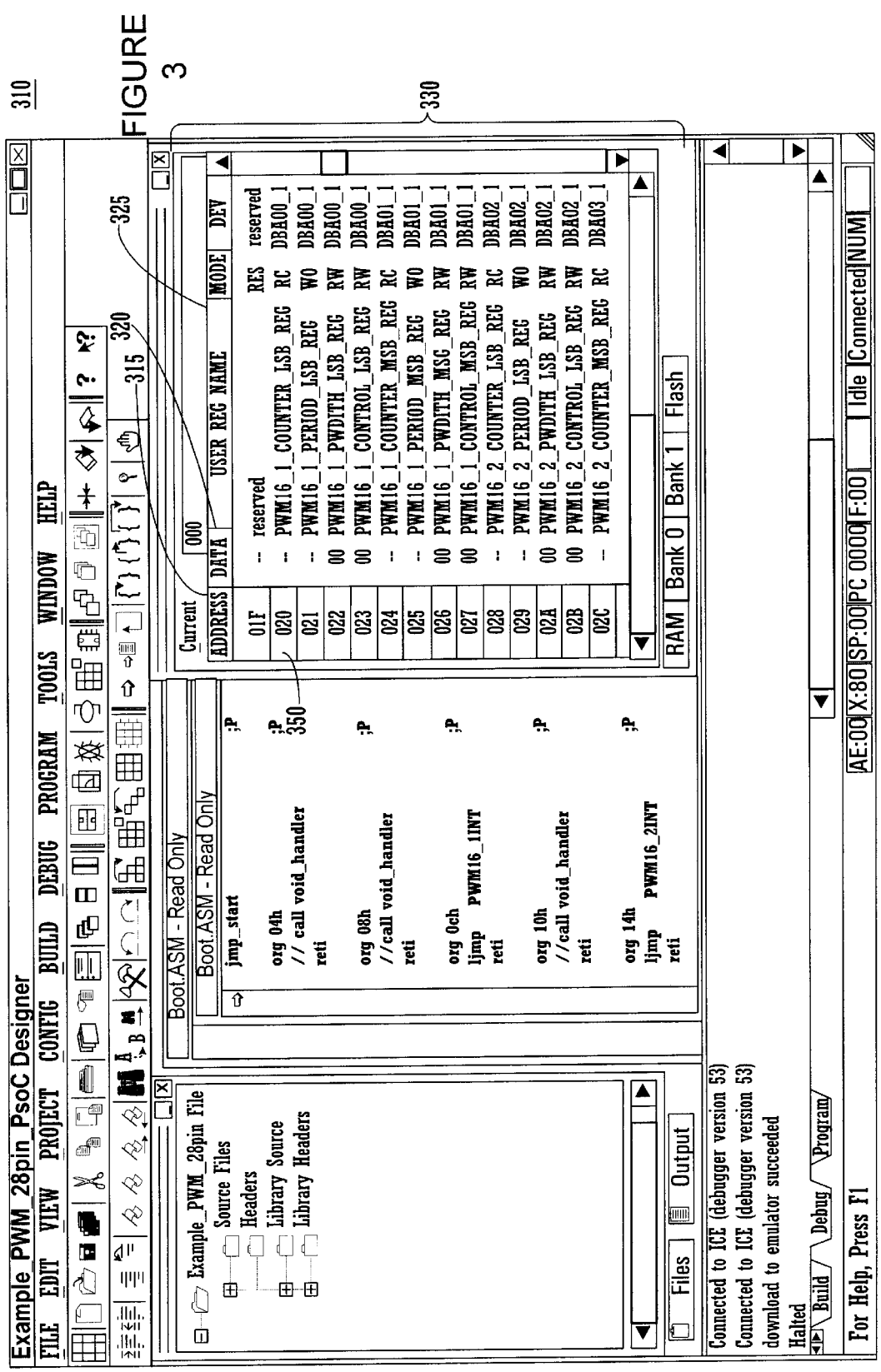
FIG. 3 illustrates a display screen from one embodiment of the invention.

FIG. 3 illustrates one embodiment of a sample display screen 310 showing a window 330 for displaying customized register names, values, and address locations associated with user modules and a specific registers. The window 330 includes an address column 315, a data value column 320, and a customized register name column 325. Each horizontal row within the address column 315, the data value column 320, and the customized register name column 325 corresponds with a specific register. For example, a row 350 represents a register that corresponds with the user module "PWM16_1" and a configuration register representing the "least significant byte." From the customized register name column 325, the customized register name is "PWM_1_COUNTER_LSB_REG". From the address column 315, the physical address for this register is "020". From the data value column 320, the data value for this register is undetermined at "- -".

In this embodiment, the listing of specific registers is performed by the definition of the resource hardware. In another embodiment, the listing can be performed in the order of the physical addresses.

If the user module is placed at a different location, then the physical address values associated with the customized register names will change accordingly.

The invention is very powerful because designers do not have to manually associate the actual physical address values with the configuration registers. The customized register names can be configured to be easy to read and remember. These customized register names can propagated to the source code. With the use of the customized register names, the source code is easier to read and program. When user modules are moved from one hardware resource to another hardware resource, the mapping of the register names to the new physical address values are performed automatically.

The foregoing descriptions of specific embodiments of the invention have been presented for purposes of illustration and description. They are not intended to be exhaustive or to limit the invention to the precise embodiments disclosed, and naturally many modifications and variations are possible in light of the above teaching. The embodiments were chosen and described in order to explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of designing an integrated circuit comprising:
   a. generating a customized register name associated with a user module and a register;
   b. linking a physical address of the register to the customized register name; and
   c. linking a value associated with the register to the customized register name.

2. The method according to claim 1 further comprising updating the physical address of the register.

3. The method according to claim 1 further comprising updating the value associated with the register.

4. The method according to claim 1 wherein generating the customized register name further comprises combining a name of the user module and a name of a function of the register as the customized register name.

5. The method according to claim 1 wherein generating the customized register name further comprises creating a unique identifier.

6. The method according to claim 1 further comprising displaying a table of a plurality of customized register names, a plurality of corresponding physical addresses, and a plurality of corresponding values.

7. The method according to claim 6 wherein displaying further comprises organizing the table according to the plurality of corresponding physical addresses.

8. The method according to claim 6 wherein displaying further comprises organizing the table according to the plurality of corresponding values.

9. A system for designing an integrated circuit comprising:
   a. a resource utilization detector configured to find a user module;
   b. a resource placement locator coupled to the resource utilization detector configured to locate a hardware resource for utilization by the user module; and
   c. a register window coordinator coupled to the resource placement locator configured to generate a customized register name associated with the user module and a configuration register.

10. The system according to claim 9 further comprising a display coupled to the register window coordinator for viewing the customized register name.

11. The system according to claim 9 wherein the register window coordinator is also configured to associate a physical address of the configuration register with the customized register name.

12. The system according to claim 11 wherein the register window coordinator is also configured to update the physical address periodically.

13. The system according to claim 9 wherein the register window coordinator is also configured to associate a value of the configuration register with the customized register name.

14. The system according to claim 13 wherein the register window coordinator is also configured to update the value periodically.

15. A system for designing an integrated circuit comprising:
   a. a resource utilization detector configured to find a user module; and
   b. a register window coordinator coupled to the resource utilization detector configured to generate a customized register name associated with the user module and a configuration register, to associate a value of the configuration register with the customized register name, and to associate a physical address of the configuration register with the customized register name.

16. The system according to claim 15 further comprising a display coupled to the register window coordinator configured to show the customized register name, the physical address, and the value.

17. A method of generating program code for a programmable electronic device comprising:
   a) associating a register textual label with a configuration register of an electronic circuit design;
   b) associating said electronic circuit design with a first programmable hardware resource, said first programmable hardware resource comprising first physical register addresses;
   c) automatically associating said configuration register with a physical address of said first physical register addresses; and
   d) rendering a display comprising said textual label of said configuration register and said physical address of said first physical register addresses.

18. A method as described in claim 17 further comprising:
   e) associating said electronic circuit design with a second programmable hardware resource, said second programmable hardware resource comprising second physical register addresses;
   f) automatically associating said configuration register with a new physical address of said second physical register addresses; and
   g) updating said display to comprise said textual label of said configuration register and said new physical address of said second physical register addresses.

19. A method as described in claim 18 wherein said display is a textual grid display further comprising a plurality of textual labels and associated respective physical addresses.

20. A method as described in claim 17 further comprising automatically generating source code for programming said programmable electronic device to implement said electronic circuit design, said source code comprising mapping between said textual label and said physical address.

21. A computer system comprising: a processor coupled to a bus and a memory coupled to said bus and comprising instructions for implementing a method of generating program code for a programmable electronic device comprising:
   a) associating a register textual label with a configuration register of an electronic circuit design;
   b) associating said electronic circuit design with a first programmable hardware resource, said first programmable hardware resource comprising first physical register addresses;
   c) automatically associating said configuration register with a physical address of said first physical register addresses; and
   d) rendering a display comprising said textual label of said configuration register and said physical address of said first physical register addresses.

22. A computer system as described in claim 21 further comprising:
   e) associating said electronic circuit design with a second programmable hardware resource, said second programmable hardware resource comprising second physical register addresses;
   f) automatically associating said configuration register with a new physical address of said second physical register addresses; and
   g) updating said display to comprise said textual label of said configuration register and said new physical address of said second physical register addresses.

23. A computer system as described in claim 22 wherein said display is a textual grid display further comprising a plurality of textual labels and associated respective physical addresses.

24. A computer system as described in claim 21 further comprising automatically generating source code for programming said programmable electronic device to implement said electronic circuit design, said source code comprising mapping between said textual label and said physical address.

* * * * *